US007435980B2

(12) United States Patent
Nakao

(10) Patent No.: US 7,435,980 B2
(45) Date of Patent: Oct. 14, 2008

(54) ELECTRON BEAM IRRADIATION DEVICE

(75) Inventor: Seitaro Nakao, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 255 days.

(21) Appl. No.: 10/590,946

(22) PCT Filed: Mar. 9, 2005

(86) PCT No.: PCT/JP2005/004092

§ 371 (c)(1), (2), (4) Date: Aug. 28, 2006

(87) PCT Pub. No.: WO2005/086176

PCT Pub. Date: Sep. 15, 2005

(65) Prior Publication Data

US 2007/0205381 A1 Sep. 6, 2007

(30) Foreign Application Priority Data

Mar. 9, 2004 (JP) ............................ 2004-065263

(51) Int. Cl.
*H01J 37/30* (2006.01)
*G21K 5/00* (2006.01)

(52) U.S. Cl. ............. 250/492.3; 250/492.1; 250/493.1; 315/111.81; 315/111.01; 118/723 EB

(58) Field of Classification Search ............. 250/492.3, 250/492.1, 493.1; 315/111.81, 111.01; 118/723 EB
See application file for complete search history.

(56) References Cited

U.S. PATENT DOCUMENTS

2006/0272579 A1* 12/2006 Nakao .................. 118/723 EB

FOREIGN PATENT DOCUMENTS

| | | |
|---|---|---|
| JP | 63-8440 | 2/1988 |
| JP | 4-127597 | 11/1992 |
| JP | 5-9680 | 2/1993 |
| JP | 5-36212 | 5/1993 |
| JP | 5-060899 | 12/1993 |
| JP | 6-80200 | 11/1994 |

* cited by examiner

*Primary Examiner*—Nikita Wells
(74) *Attorney, Agent, or Firm*—Ladas & Parry LLP

(57) ABSTRACT

An electron beam irradiation device having an electron beam generating unit R, an irradiation chamber E for irradiating an electron beam to a irradiated object F, and an oxygen cutoff section S for blowing inert gas N on an upstream side of the irradiated chamber. The oxygen cutoff section is designed so that a gap Ws between partitions across the irradiated object is smaller than a gap We between the partitions across the irradiated object in the irradiation chamber (Ws<We). The gap Ws is made uniform, or almost uniform, throughout the entire area of the oxygen cutoff section, and a blowing slit 55 for blowing the inert gas to the processing surface of the irradiated object is provided on a partition with no projection nor recess involved.

8 Claims, 7 Drawing Sheets

ELECTRON BEAM IRRADIATION DEVICE

TECHNICAL FIELD

The present invention relates to an electron beam irradiation device and more particularly to an electron beam irradiation device for improving use of inert gas more efficient.

BACKGROUND ART

There is known an electron beam irradiation device for irradiating an electron beam to a belt-shaped irradiated object and conducting a processing such as bridging, hardening or reforming to the irradiated object. As an irradiated object, for example, a resin film itself or a resin film coated with an electron beam curing resin coating is representative. However, in general, the reaction (processing) such as bridging of molecule induced by an electron beam is inhibited by oxygen existing in the atmosphere. For preventing the inhibition, for example, following methods are employed.

In an electron beam irradiation device described in the patent publication 1 an irradiated object is a film coated by an electron beam curing resin coating material. When the coating material coated on the film is bridged or cured by the electron beam, the coated film is brought into contact with a metal dram rotating at a circumferential speed synchronizing with the traveling speed of the film with a coating material being sandwiched therebetween, and in this state, the electron beam is irradiated from the film side. The electron beam irradiation device is of the type in which the electron beam curing resin coating material is blocked from oxygen existing in the atmosphere by making it contact the metal drum, and then the inhibition of curing (process for the irradiated object by electron beam) is prevented. Hereinafter such type is referred to as “type A”.

In the electron beam irradiation device of the type A, the electron beam is transmitted and penetrates all layers of the irradiated object and then reaches the layer (coating material) which need be processed by the electron beam. Therefore, a layer existing on the way of the beam, even though its do not need to be processed by the electron beam, is affected by the electron beam and undesirable reaction (such as yellowing or strength degradation) occurs. Part of the energy is absorbed in the layer on the way, thus the energy of the electron beam reaching the layer (coating material) which really need to be processed is wasted. The electron beam irradiation device needs a metal drum and a rotation drive mechanism thereof. Therefore, the device becomes heavy, thick, long and large more than required. Further, in a processing by the electron beam irradiation, especially in a curing process of coating material, a surface luster of the coating material is inevitably controlled by a surface luster of the metal drum.

As an electron beam irradiation device of the type which does not have such defects, following devices are known.

An electron beam irradiation device, described the patent application 2, the patent application 3, or the patent application 4 is of the type in which an electron beam is irradiated to an irradiated object in an irradiation chamber consisting of a shut space where an inert gas such as nitrogen is supplied, and is filled with the space. Hereinafter such type is referred to as “type B”.

Above irradiation chamber has a feed-in opening for feeding a belt-shaped irradiated object into the irradiation chamber and a feed-out opening for feeding the belt-shaped irradiated object out of the irradiation chamber. At the upstream (the upstream of the feeding direction of the irradiated object) of the feed-in opening in the irradiation chamber, a duct and a cavity for catching an X-ray of a bremsstrahlung are formed, and an air knife projecting as a nozzle toward the irradiated object for blowing an inert gas (nitrogen) in the cavity is provided. The air knife blocks oxygen in the air entering accompanied the irradiated object from the outside, and dilutes the oxygen which cannot be blocked.

That is to say, the type B prevents the inhibition of oxygen which may occur in the processing of the irradiated object by electron beam by dipping the irradiated object within an inert gas such as nitrogen which does not inhibit a process reaction by electron beam.

Patent Publication 1: JP-B-H05-36212

Patent Publication 2: JP-B-S63-8440

Patent Publication 3: JP-A-H05-60899

Patent Publication 4: J-U-H06-80200

DISCLOSURE OF THE INVENTION

Problem to be Solved by the Invention

The type B prevents the electron beam irradiation device from becoming heavy and big. Further, the type B, especially when the processing of the irradiated object by electron beam is the curing of coating material, has another advantage that the processing surface (coated surface) does not controlled by a luster of others. On the other hand, during the electron beam is irradiating while the belt-shaped irradiated object is traveling, oxygen accompanying the irradiated object is continuously flowing into the irradiation chamber from the outside. Therefore, for continuously keeping an oxygen concentration at adequately low level, it is necessary to supply a large quantity of inert gas continuously, and as a result, the cost thereon also becomes high.

In particular, if a processing speed (traveling speed) of the irradiated object becomes high, quantity of inflow oxygen also increases along with the increase of the speed, so that the oxygen concentration in the irradiation chamber suddenly rises, and that it becomes impossible to prevent the inhibition occurring in the electron beam processing.

An object of the present invention is to prevent an electron beam irradiation device from becoming heavy and big, and is to improve the electron beam irradiation device of the type B having an advantage that a processing face does not controlled by the luster in the case of the curing of coating especially in a curing processing, thereby restraining an increase of the oxygen concentration in the irradiation chamber and reducing a consumption of the inert gas even though the traveling speed of the belt-shaped irradiated object becomes high.

Means for Solving the Problem

To solve the above problems, (D) An electron beam irradiation device for irradiating an electron beam to a belt-shaped irradiated object while making the irradiated object travel is, (E) the electron beam irradiation device comprising:

(A) an electron beam generating section which generates the electron beam and emits the electron beam to an outside from a transmission window part;

(B) an irradiation chamber adjacent to the transmission window part of the electron beam generating section, having partitions surrounding a periphery, a feed-in opening which opens on the partition to allow the belt-shaped irradiated object to be fed in, and a feed-out opening which opens on the partition to allow the belt-shaped irradiated object to be fed out, and formed as a closed space filled with inert gas, in which the electron beam emitted from the transmission window section is irradiated to the belt-shaped irradiated object fed in from an outside and travels the inside; and (C) an oxygen cutoff section adjacent to the irradiation chamber on an upstream side in an irradiated object traveling direction, having a feed-in opening for feeding in the belt-shaped irradiated object, and a feed-out opening for feeding out the belt-shaped irradiated object, and formed as a closed space, in which the belt-shaped irradiated object travels to be introduced to the irradiation chamber, the inert gas is blown to the irradiating surface side of the irradiated object, and oxygen in the air accompanying a vicinity of a surface of the irradiated object to flow in is shut off or diluted, wherein:

(C1) the oxygen cutoff section surrounds the irradiated object with a surface side partition facing a side of the irradiating surface of the traveling belt-shaped irradiated object, a backface side partition facing to a side opposite to the irradiating surface of the irradiated object, and a pair of sideface side partitions facing both sideface sides of the irradiated object, (C2) a gap Ws between the surface side partition and the backface side partition of the oxygen cutoff section, and a gap We between the surface side partition and the backface side partition of the irradiation chamber and across the belt-shaped irradiated object in the irradiation chamber satisfy an inequality Ws<We, (C3) the gap Ws between the surface side partition and the backface side partition of the oxygen cutoff section is made uniform or almost uniform throughout an entire area of the oxygen cutoff section and, (C4) a blowing slit for the inert gas is provided on the surface side partition of the oxygen cutoff section, with a blowing opening thereof being not projected form or caved in the surface side partition of the oxygen cutoff section.

Having such a configuration, firstly it is possible to prevent the electron beam irradiation device from becoming heavy and big because a metal drum is unnecessary in this system, and especially when the processing is a curing of a coating material, the processing surface is not controlled by a luster of others. Moreover, by the oxygen cutoff section which is a characteristic configuration of the present invention, even though the traveling speed of the belt-shaped irradiated object becomes high, an increasing in an oxygen concentration in the irradiation chamber can be restrained, and consumption of the inert gas can be reduced. Therefore, the use of the inert gas becomes effectively.

In one embodiment of the present invention, a coating part for coating a liquid electron beam curing resin in a non-curing state on the surface of the irradiated object on the upstream side in the irradiated object traveling direction in the oxygen cutoff section may be provided.

Having such a configuration, coating film formation of the electron beam curing resin and processing of the coating film by the electron beam are effectively conducted in line.

In one embodiment of the present invention, the gap Ws between the surface side partition and the backface side partition of the oxygen cutoff section may be set to be wider than a thickness of the irradiated object by a range of 1-20 mm. By setting in this range, even if the traveling speed of the irradiated object increases up to about 200 m/min., the oxygen concentration in the irradiation chamber can be restrained equal to or less than 100 ppm.

In one embodiment of the present invention, the slit may be formed so that a blowing direction of the inert gas from the slit inclines toward the upstream side in the traveling direction relative to a direction perpendicular to the traveling direction of the irradiated object. By inclining the slit in this way, the inert gas blown from the slit collides against the entering air accompanying the irradiated object like a knife edge, and the accompanying air is striped off from the irradiated object effectively, then the air can be pushed out from the feed-in opening of the oxygen cutoff section.

In one embodiment of the present invention, on a downstream side relative to the slit in the traveling direction of the irradiated object, a gas supplying hole for supplying the inert gas for the irradiated object from the same side as the slit may be provided. According to this embodiment, the air accompanying the irradiated object is striped off by the inert gas blowing from the slit to restrict the entering of the accompanying air to the irradiation chamber, while the irradiated object can be supported by a supporting layer formed by the inert gas which is supplied from the gas supplying hole. Accordingly, the flapping of the irradiated object caused by a variation of pressure balance between the front and back of the irradiated object, which is involved by the blowing of the inert gas from the slit, is restrained, while the irradiated object is allowed to travel in the oxygen cutoff section smoothly.

In a configuration provided with the gas supplying hole, a throttle valve for reducing a flow velocity of the inert gas blowing out from the gas supplying hole lower than a flow velocity of the inert gas blowing from the slit may be comprised. By providing such throttle valve, it is possible to blow the inert gas from the slit at a high speed to thereby drain the accompanying air adequately, while to supply the inert gas of the amount necessary for supporting the irradiated object from the gas supplying hole to thereby restrain the flapping of the irradiated object adequately.

In a configuration provided with the gas supplying hole, the gas supplying hole may be formed as a through hole extending in a direction perpendicular to the traveling direction of the irradiated object. By forming the gas supplying hole as a through-hole in such a way, the inert gas supplied from the gas supplying hole is allowed to stay around the gas supplying hole relatively for a long time, and the supporting layer of the irradiated object by the inert gas can be formed effectively. Further, by setting a diameter of the gas supplying hole grater than the gap of the slit, the flow velocity of the inert gas supplied from the gas supplying hole can be restrained relatively easy.

Effect fo the Invention (1) According to the electron beam irradiation device of the present invention, firstly, it is possible to prevent the electron beam irradiation device from becoming heavy and big, and the processing surface is not controlled by the luster of others when the curing process of the coating material is conducted, so that any luster surface can be allowed. Moreover, when the traveling speed of the belt-shaped irradiated object becomes high, an increase of the oxygen concentration in the irradiation chamber is restrained, and a consumption of the inert gas can be reduced. Therefore, the use of inert gas becomes effectively.

(2) Further, in a case that the coating part is provided on the upstream side of the oxygen cutoff section, coating film formation of the electron beam curing resin and an electron beam processing of the coating film can effectively be conducted in-line.

EXPLANATION OF THE REFERENCE NUMERALS

C Cooler
D Drying-Machine
E Electron Beam
E Irradiation Chamber
$E_a$ Irradiation Chamber Moving Side
$E_b$ Irradiation Chamber Fixing Side
E1 Feed-in Opening of Irradiation Chamber
E2 Feed-out Opening of Irradiation Chamber
E3 Surface Side Partition
E4 Backface Side Partition
E5 Transmission Window Part
F Irradiated Object
Lc Feeding Roller
Ln Conveying Roller
M Moving Means
Mw Truckle
M1 Rail
N Inert Gas
P Conduit
P1 Gathering Part
P2 Gathering Part
P3 Distribution Pipe
P4 Distribution Pipe
P5 Junction Part
P6 Main Pipe
P7 Valve
P8 Valve
P9 Valve
P10 Valve
R Electron Beam Generating Section
Ra Wind-off Roll
Rr Wind-up Roll
$S_A$ Oxygen Cutoff Section Moving Side
$S_B$ Oxygen Cutoff Section Fixing Side
S1 Feed-in Opening of Oxygen Cutoff Section
S2 Feed-out Opening of Oxygen Cutoff Section
S3 Surface Side Partition
S4 Backface Side Partition
S5 Blowing Slit
S6 Space
S7 Gas Supplying Hole
S8 Space
T Coating Part
T1 Plate Cylinder
T2 Ink Pan
T3 Doctor Blade
T4 Impression Cylinder
V Traveling Direction
Ws Gap Between Partitions in Oxygen Cutoff Section
We Gap Between Partitions in Irradiation Chamber

Best Mode for Carrying Out the Invention

In the followings, the best mode for carrying out the present invention will be described with reference to the drawings.

[Brief Description of the Drawings]

Figure 1:
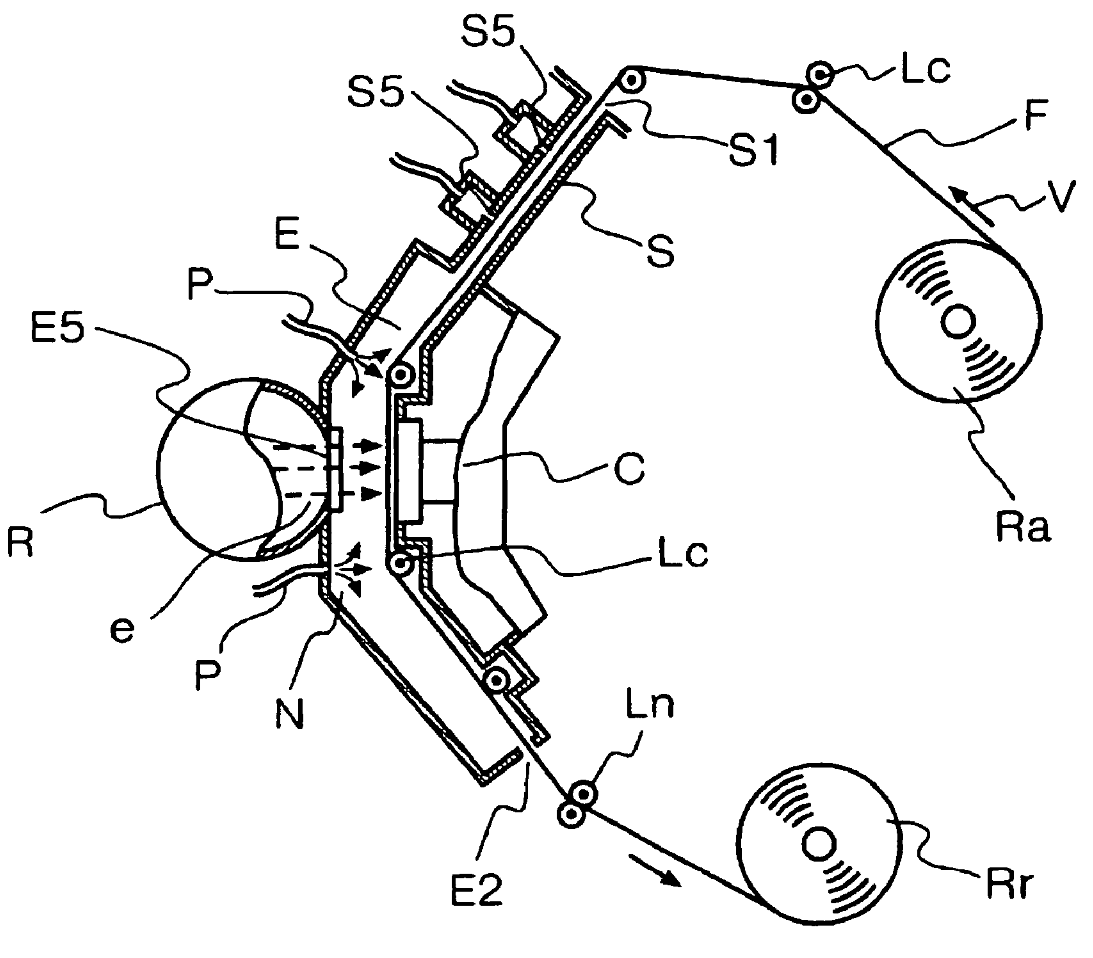
FIG. 1 is an explanatory view showing a fundamental embodiment (with no coating part) of the electron beam irradiation device of the present invention in conceptual partly sectional view.
Figure 2:
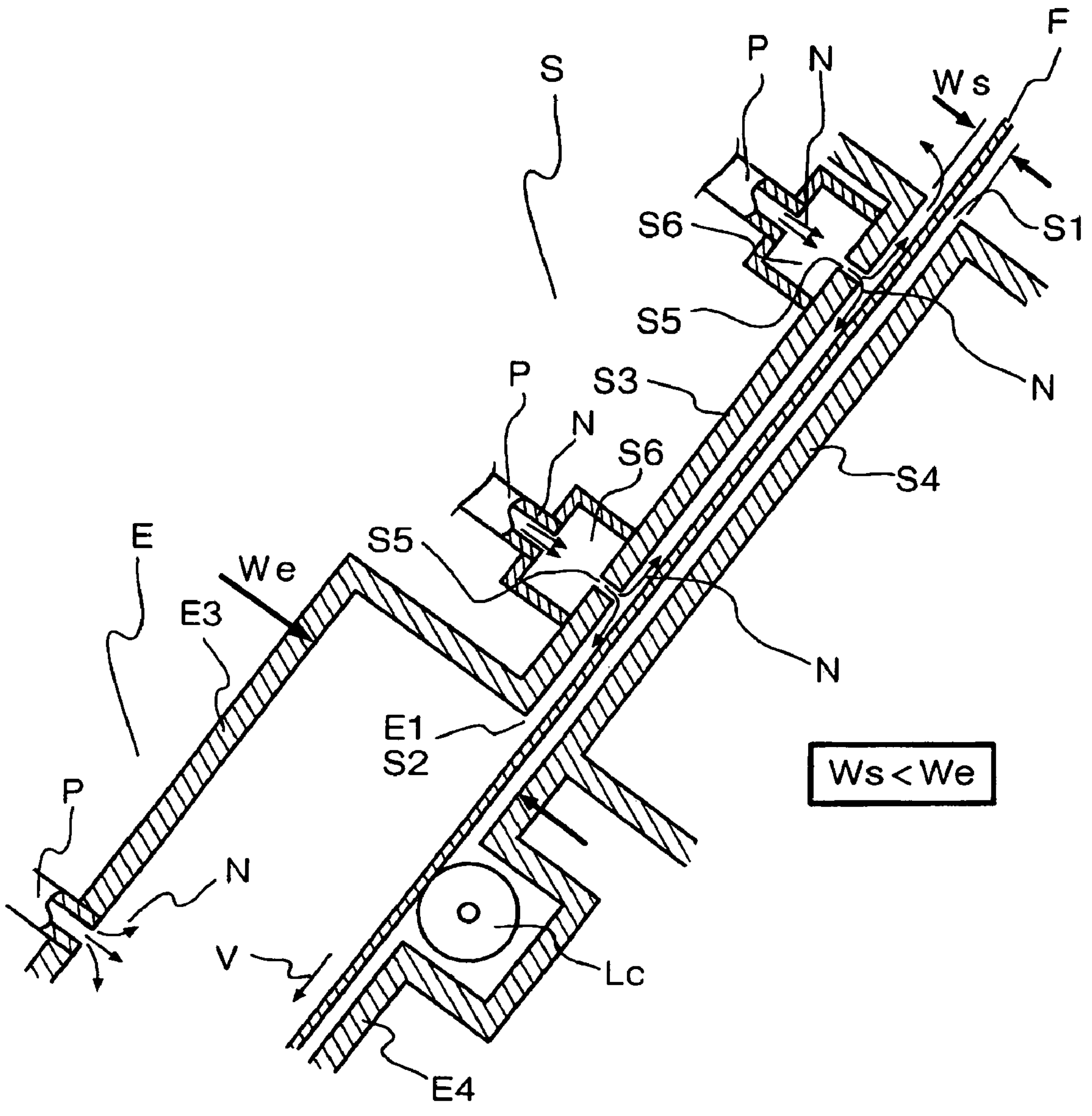
FIG. 2 is an enlarged sectional view showing an embodiment of the oxygen cutoff section S which is characteristic part of the present invention.
Figure 3:
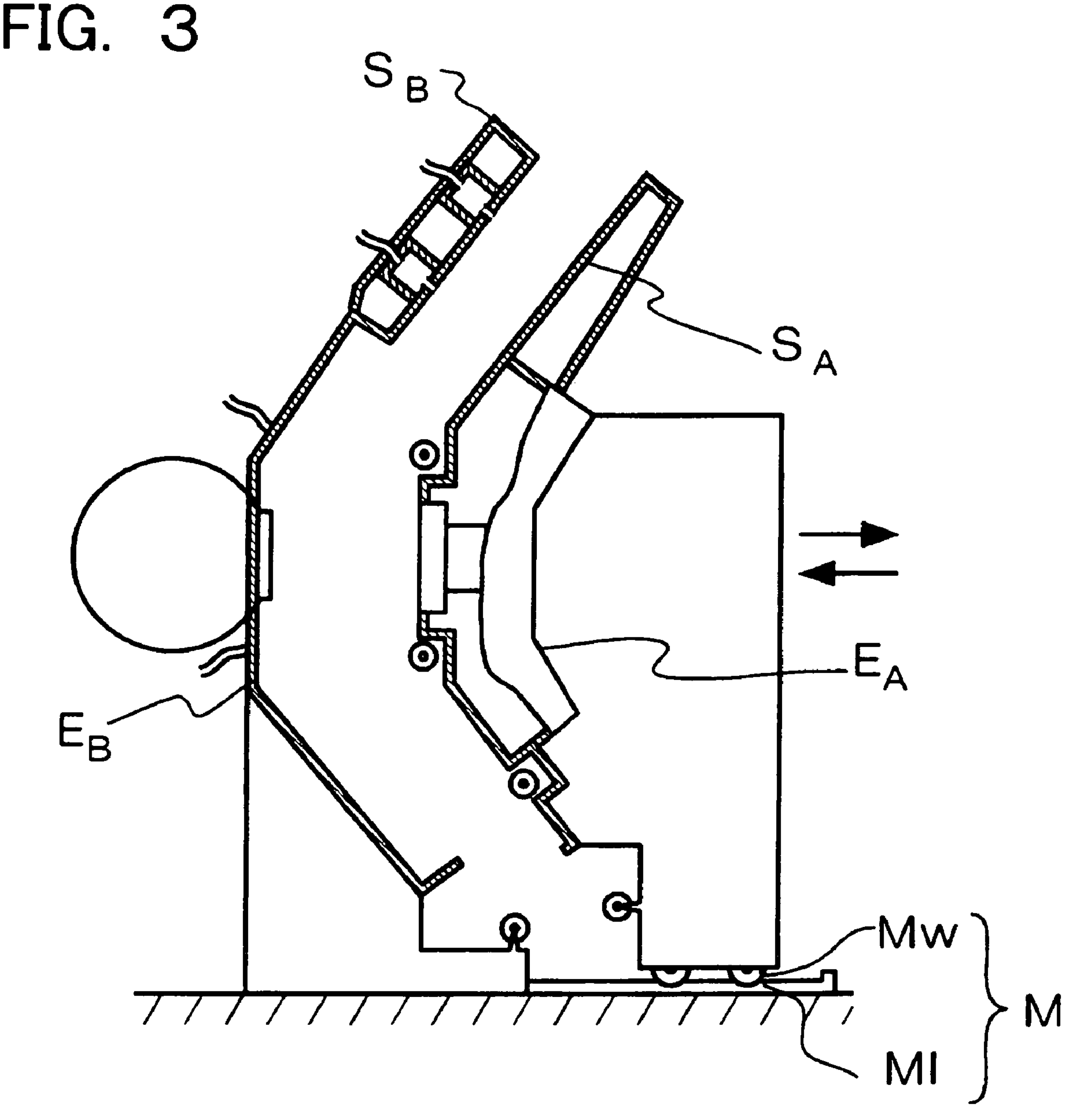
FIG. 3 is an explanatory view showing an embodiment in which the oxygen cutoff section S and the irradiation section E can be divided into two pieces each.
Figure 4:
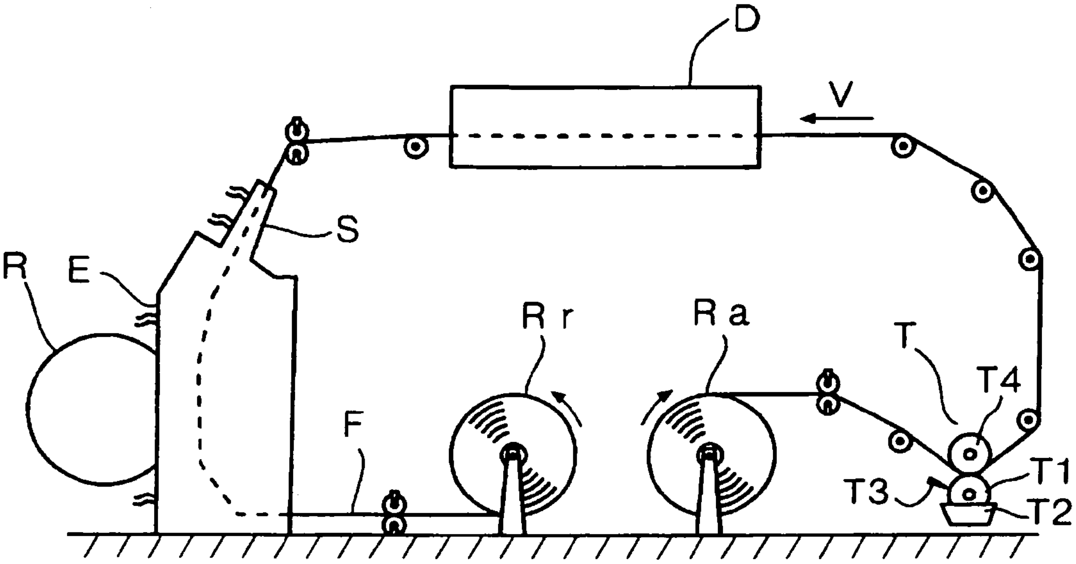
FIG. 4 is an explanatory view showing an embodiment of the electron beam irradiation device having a coating part.

First, FIG. 1 is an explanatory view showing a fundamental embodiment (with no coating part) of the electron beam irradiation device of the present invention in conceptual partly sectional view. FIG. 2 is an enlarged sectional view showing an embodiment of the oxygen cutoff section S which is characteristic part of the present invention. FIG. 3 is an explanatory view showing an embodiment in which the oxygen cutoff section S and the irradiation section E can be divided into two pieces each. That is to say, FIG. 3 is the explanatory view showing an embodiment in which the oxygen cutoff section S is provided with an oxygen cutoff section moving side $S_A$ and an oxygen cutoff section fixing side $S_B$, both of which can be engaged mutually, divided horizontally and separated from each other, and in which the irradiation section E is provided with an irradiation section moving side $E_A$ and an irradiation section fixing side $E_B$, both of which can be engaged mutually divided horizontally and separated from each other. FIG. 4 is an explanatory view showing an embodiment also having a coating part on the upstream side of the oxygen cutoff section S. The electron beam irradiation device of the present invention is not limited by the drawings without departing from the scope of the present invention.

[Summary of Entire Device]

A summary of the entire device will be explained with reference to a fundamental embodiment of the irradiation device of the present invention illustrating in FIG. 1.

As illustrated in FIG. 1, the electron beam irradiation device of the present invention comprises an electron beam generating section R generating an electron beam e, an irradiation chamber E for irradiating electron beam to a traveling belt-shaped irradiated object F, and an oxygen cutoff section S disposed next to and on the upstream side of the irradiation chamber E. In the figure, the belt-shaped irradiated object F is wound off from a wind-off roll Ra, guided by feeding rollers Lc, enters in the electron beam irradiation device from the feed-in opening S1 of the oxygen cutoff section S. Then, the object F is irradiated with the electron beam e during traveling in the irradiation chamber E, exits from the out side of the device from a feed-out opening E2 of the irradiation chamber, guided by a conveying rollers Ln, and wound up by wind-up rolls Rr.

The oxygen cutoff section S is provided adjacent on the upstream side of the irradiation chamber E as shown in the sectional view of FIG. 2. In the present invention, the words "an upstream" and "a downstream" are on the basis of a traveling direction V of the belt-shaped irradiated object F. Seeing from the electron beam irradiation device, the direction to the supplying source of the irradiated object F, that is to say, the direction to the wind-off roll Ra is referred to as "an upstream". On the hand, seeing from the electron beam irradiation device, the direction from which the irradiated object F is supplying, that is to say, the direction to the wind-up roll Rr is referred to "a downstream".

In such an electron beam irradiation device, characteristic configurations of the present invention are that a gap Ws between a surface side partition and a backface side partition across the irradiated object F in the oxygen cutoff section S and a gap We between a surface side partition and a backface side partition across the irradiated object in the irradiation chamber E satisfy an inequality Ws<We, the gap Ws is made uniform or almost uniform throughout the entire area of the oxygen cutoff section, and a blowing slit S5 for blowing inert gas is provided in the surface side partition with not projecting from and not caving in the partition.

An inside of the chamber is maintained in the condition that oxygen concentration is low by introducing the inert gas into the irradiation chamber E from conduits P. The electron beam e generated in the electron beam generating section R transmits through a transmission window part E5, and the electron beam is irradiated to the irradiated object F. A cooler C (electron beam acquisition device) is provided on the backside of the irradiated object where the electron beam is irradiated.

The inert gas N which is used in the oxygen cutoff section and the irradiation chamber is, for example, rare gas such as argon, helium, neon, or nitrogen, however, the nitrogen is usually used mainly because of the cost.

As for the irradiated object F, as far as it is a belt-shaped thin film or sheet, any object can be used. As for the thickness, the irradiated object F having a thickness of about 5-300 μm is usually intended. As for a concrete electron beam processing, for example, there is a processing for conducing bridging (reaction) of molecule by an electron beam irradiation on the irradiated object of a resin film itself such as polyethylene film as an irradiated object. In addition, for example, there is a processing for conducting a bridging or curing the coating material contained on the irradiated object by electron beam irradiation, wherein the irradiated object is a film made of resin of polyester or film-like material such as paper or metallic foil coated by an electron beam curing resin coating material consisted of monomer of acrylate or prepolymer.

[Oxygen Cutoff Section]

Next, the configuration of the oxygen cutoff section S which is a characteristic part of the present invention will be described in detail, with reference to FIG. 2 showing an embodiment of the configuration.

The oxygen cutoff section S is formed as closed space surrounded by partitions (except feed-in part and the feed-out part of the irradiated object F). These partitions comprise a surface side partition S3 facing toward the irradiating side of the traveling belt-shaped irradiated object F, a backface side partition S4 facing toward the opposing side of the irradiating side of the irradiation surface of the irradiated object, and a pair of sideface side partitions facing toward to the both sides of the irradiated object (not shown). Metal such as an iron on aluminum is usually used for material of these partitions. The oxygen cutoff section S also has a feed-in opening S1 for feeding the irradiated object F into the oxygen cutoff section S and a feed-out opening S2 for feeding it out from the oxygen cutoff section S. Moreover, the surface side partition S3 of the oxygen cutoff section S is provided with one or more blowing slits S5 for blowing inert gas in to the oxygen cutoff section.

In the present invention, a gap Ws between the surface side partition S3 and the backface side partition S4 of the oxygen cutoff section S, and a gap We between the surface side partition E3 and the backface side partition E4 of the irradiation chamber and across the belt-shaped irradiated object in the irradiation chamber described later satisfy an inequality Ws<We.

Accordingly, first, an air existing outside of the feed-in opening S1 is blocked by the partitions when entering in the feed-in opening S1 of the oxygen cutoff section S. Subsequently, because the gap Ws is narrow, the fluid resistance becomes high against a high oxygen concentration air which adhering to front and back surfaces of the irradiated object F by a viscous resistance and entering into the oxygen cutoff section S accompanying the object. Therefore, the accompanying air is stripped off from the irradiated object surface, and velocity of the accompanying air toward the irradiation chamber E is reduced.

In addition, the inert gas N is continuously supplied to the oxygen cutoff section S from the blowing slits S5 for blowing the inert gas provided on surface side partition S3. Therefore, oxygen in the oxygen cutoff section S is diluted (decreased in concentration). Further, the oxygen in the upper streams of the oxygen cutoff section S is dragged and forced out by the inert gas flowing out from the feed-in opening S1.

Moreover, the gap Ws is made uniform or almost uniform throughout the entire area of the oxygen cutoff sections in the traveling direction of the irradiated object. The less the gap Ws is, the more preferable because the rising of the oxygen concentration in the irradiation chamber caused by an inflow of the oxygen in the air is prevented. However, if the gap Ws becomes too narrow, there is a possibility of raising the inconvenience that the traveling irradiated object tends to touch the partitions. Therefore, taking both into consideration, the appropriate width is decided. Usually, the width of the gap Ws is greater than the thickness of the irradiated object by the extent of 1-20 mm. With in this range, even if the traveling speed of the irradiated object is increased around 200 m/min, the oxygen concentration in the irradiation chamber E can be restrained less than 100 ppm.

Moreover, on the surface side partition S3 of the oxygen cutoff section S, one of more blowing slits S5 for blowing inert gas to the oxygen cutoff section are provided. As shown in FIG. 2, each blowing slit S5 is formed with not projecting from and not caving the surface side partition S3, more in detail, the inside surface of the partition S3. That is to say, the inside surface of the surface side partition S3 on the side of irradiated object F, which includes the part of the blowing slit S5, is formed in generally flat surface on which concavity and convexity can be substantially ignored thereover. However, other than complete flat surface as shown in the figure, a smoothly curvature surface is also admitted. In the case, traveling path of the fed belt-shaped irradiated object has also the same or almost the same curvature surface as the partition.

As described above, as well as the gap Ws in the oxygen cutoff section S being narrow, the gap Ws is made uniform or almost uniform throughout the entire area of the oxygen cutoff section S. Further as the blowing slit S5 is provided with not projecting from and not caving (almost flat) on the surface side partition S3, the inert gas blown to the oxygen cutoff section S does not circulate or stagnate, then separation of the accompanying air layer, dilution of oxygen, and pushing out the air to the upper stream or the like is conducted smoothly. Therefore quantity of oxygen flowing into the irradiation chamber E from the oxygen cutoff section S is excessively reduced.

Further, from the aspect of quantity of inert gas used, the gap Ws between the surface side partition and the backface side partition of the oxygen cutoff section S is set small of narrow, and the gap Ws is made uniform or almost uniform throughout the entire area of the oxygen cutoff section S, so that the internal volume of the oxygen cutoff section S is kept in necessary minimum. Therefore quantity of inert gas to be supplied to the oxygen cutoff section S is kept in necessary minimum. Consequently, quantity of the inert gas use to make the oxygen concentration low can be saved.

In addition, in view point of stopping an oxygen flow into the air, the blowing slit S5 for blowing inert gas is preferably provided on the upper streams in the oxygen cutoff section S.

The conduits P are connected to the blowing slits S5, and via the conduits P, inert gas N is supplied. Further, in the embodiment of FIG. 2, for buffering the fluctuation of quantity of spout and blowing pressure of the inert gas, spaces S6 are provided in behind of the blowing slits S5. Therefore, the inert gas N from conduits P is supplied to the slits S5 via the spaces s6.

In addition, each blowing slit S5 is provided at least on the processing surface side of the electron beam irradiation of irradiated object F. Usually, the electron beam irradiation side becomes the processing surface, thus in the configuration such as shown in FIG. 2, the blowing slit S5 can be provided on the surface side partition S3. However, the blowing slit S5 can be provided on both sides of the processing surface of the electron beam irradiation and the opposite side.

[Electron Beam Generating Section]

An electron beam generating section R generates electron beam and emits the electron beam to outside from transmission window part E5, and an existing electron beam generator can appropriately be employed as it. Such an electron beam generator is available from NHV Corporation Co., Ltd., or Energy Science Company (ESI Company) in USA, for example.

[Irradiation Chamber]

The irradiation chamber E, as shown in FIG. 1, is adjacent to the transmission window part E5 of the electron beam generating section R, and constructs a closed space (excepting feed-in/feed-out parts of the irradiated object) which is surrounded by partitions in periphery. By filling the irradiation chamber E with inert gas N to keep oxygen concentration low (equal to or less than about 300 ppm normally), and in such a low oxygen concentration atmosphere, by irradiating the electron beam e on the irradiated object F, the electron beam processing such as bridging, polymerization, decomposition or curing is conducted.

The partitions of the irradiation chamber E are usual made by metal such as ferrum or aluminum. Parts especially required to be cut off from X-rays of bremsstrahlung are formed with enough thickness using metal having a high X-ray shielding capability, such as plumbum.

Furthermore, the irradiation chamber E connects to the oxygen cutoff section S provided on up side thereof. The partition of the oxygen cutoff section S on the side of the irradiation chamber E is provided with a feed-in opening E1 for feeding in the irradiated object F. The downstream in the irradiation chamber E is provided with a feed-out opening E2 for feeding out the irradiated object F. The belt-shaped irradiated object F travels between the feed-in opening E1 and the feed-out opening E2. In addition, for aiding the traveling of the irradiated object F, a feeding roller Lc is optionally provided in the irradiation chamber. In the embodiment of FIGS. 1 and 2, the feed-in opening E1 of the irradiation chamber E and the feed-out opening S2 of the oxygen cutoff section S are identical to each other on dual purposed.

For keeping the oxygen concentration in the irradiation chamber E low, the inert gas N is supplied via a conduits P to the irradiation chamber E, and the chamber is filled up with the gas. In addition, on the opposite side of the electron beam generating section R of the irradiated object F, there is provided a cooler (an electron beam capture device) C for catching the electron beam transmitted through the irradiated object F and for cooling heat occurring when the transmitted beam is caught.

As described above, the gap We between both partitions across the irradiated object F in the irradiation chamber E, is made greater or wider than the gap Ws between the surface side partition S3 and the backface side partition S4 of the oxygen cutoff section S. The oxygen which could not be removed completely in the oxygen cutoff section S may enter into the irradiation chamber E accompanying the traveling irradiated object F. Although the quantity thereof is low, if it is integrated for a long time, the increase of the oxygen concentration becomes impossible to ignore. Thus, it is necessary for supplying the inert gas continuously to the irradiation chamber E via conduits P, and for making a volume big to some extent to dilute the flowing-in oxygen and to desensitize to density increase. Therefore, setting the gap We slightly greater while satisfying We>Ws.

In this way, by making the volume of the irradiation chamber E greater than that of oxygen cutoff section S while satisfying We>Ws, the oxygen flowing to the irradiation chamber E from the oxygen cutoff section S can be largely diluted.

Further, by lowering density of the oxygen in the oxygen cutoff section S and in the irradiation chamber E, it becomes possible to keep the oxygen concentration in the irradiation chamber low. Therefore, when traveling speed of irradiated object F is high, the oxygen concentration hardly increases.

Furthermore, in view of quantity of usage of the inert gas, by providing the oxygen cutoff section S on upstream part, when the accompanying air around the irradiated object enters in the irradiation chamber E, the oxygen concentration of the irradiation chamber E has already been reduced. Consequently, a little quantity of the inert gas to be supplied to the irradiation chamber is enough.

In the oxygen cutoff section S described above, by setting the gap Ws between the surface side partition and the backface side partition small or narrow, and by making the gap Ws be uniform or almost uniform throughout the entire area of the oxygen cutoff section, a size of the internal volume of the oxygen cutoff section S is necessary minimum. Therefore, quantity of the inert gas to be supplied to the oxygen cutoff section S becomes necessary minimum.

Thus, quantity of usage of the inert gas for reducing the oxygen concentration can be reduced.

[Dividable Construction]

Not explicitly illustrated in FIGS. 1 and 2, however, in order to facilitate a “paper passing” for passing the irradiated object through the electron beam irradiation device and such as maintenance of the device, the electron beam irradiation device employs a structure capable of being divided, with a traveling face of the irradiated object traveling in the device or the vicinity thereof serving as a dividing face. Of course, if there are no obstacles for the paper passing and for maintenance, the dividing structure is not required.

FIG. 3 is one example of the dividable structure employed in the electron beam irradiation device of the present invention. It is an example of the structure in which the irradiated object traveling face in the electron beam irradiation device is vertical or substantially vertical and which the device can be divided horizontally in two.

The dividable structure shown in FIG. 3 shows one embodiment of the configuration, in which the oxygen cutoff section S thereof is divided in two of an oxygen cutoff section moving side $S_A$ and an oxygen cutoff section fixing side $S_B$, and both of which are engaged mutually, and of an irradiation section E is also divided in two of an irradiation section moving side $E_A$ and an irradiation section fixing side $E_B$, both of which can be engaged mutually. The oxygen cutoff section moving side $S_A$ and the irradiation section moving side $E_A$ are movable horizontally, and the oxygen cutoff section fixing side $S_B$ and the irradiation section fixing side $E_B$ are fixed. By providing seal means such as a packing on the engaging faces of each moving side of the oxygen cutoff section moving side $S_A$ and the irrigation section moving side $E_A$, and each fixed side of the oxygen cutoff section fixing side $S_B$ and the irradiation section fixing side $E_B$, the irradiation chamber E and the oxygen cutoff section S are sealed and shut off from the outside when they are engaged. When the operation of the electron beam irradiation device is stopped, and maintenance, checking, cleaning or the like of the inside is conducted, both of moving sides of the oxygen cutoff section moving side $S_A$ and the irradiation section moving side EA and fixing sides of the oxygen cutoff section fixing side $S_B$ and the irradiation section fixing side $E_B$ are divided. FIG. 3 illustrates the divided state.

The oxygen cutoff section moving side $S_A$ and the irradiation section moving side $E_A$ of the moving side are approachable to and dividable from the oxygen cutoff section fixing side $S_B$ and the irradiation section fixing side $E_B$ which are fixed on floor by displacement means M.

As a moving mechanism M, it is possible to use a mechanism having a rail M1 provided on the floor and truckles Mw, and a drive mechanism (not illustrated) such as a hydraulic cylinder and a piston may be provided, if necessary. In FIG. 3, the side to which the electron beam generating section R is attached is the fixed sides $S_B$ and $E_B$, however, the side to which the electron beam generating section R may be the moving sides.

Next, referring to FIG. 4, another embodiment according to the electron beam irradiation device of the present invention will be explained.

FIG. 4 shows an explanatory view which illustrates another embodiment of the electron beam irradiation device, in which a coating part T is further provided to the electron beam irradiation device of the embodiment illustrated in FIG. 1. The electron beam irradiation device shown in FIG. 4 has the coating part T between the oxygen cutoff section S and the wind-off roll Ra of the electron beam irradiation device of FIG. 1 along with the irradiated object F. The coating part T may appropriately employ a known coating means. In the illustrated example, the coating part T is a known photogravure coater, comprising an ink pan T2 in which liquid ink consisting of electron beam curing resin is filled, a plate cylinder T1 consisting of a graver printing plate rotating with a bottom half dipping into the coating material in the ink pan T2, a doctor blade T3 for scraping off surplus coating material on the surface of the plate cylinder T1, and an impression cylinder T4 for transferring the coating material filled in a minute cell on the surface of plate cylinder T1 to the surface of the irradiated object F by pressurizing the irradiated object F from the opposite side of the plate cylinder T1. As a coating part, a roll coater, curtain flow coater, comma coater or the like may be used other than the illustrated gravure coater, Furthermore, in the illustrated embodiment, a drying-machine D is provided between the coating part T and the oxygen cutoff section S along with the irradiated object F. The drying-machine D is used for drying and removing dilution solvent when the solvent is included in the coating material. If the solvent is not included in the coating material, the drying-machine D may be omitted. As a drying-machine D, a known system on structure such as hot blast blowing or infrared radiation can be used.

Figure 5:
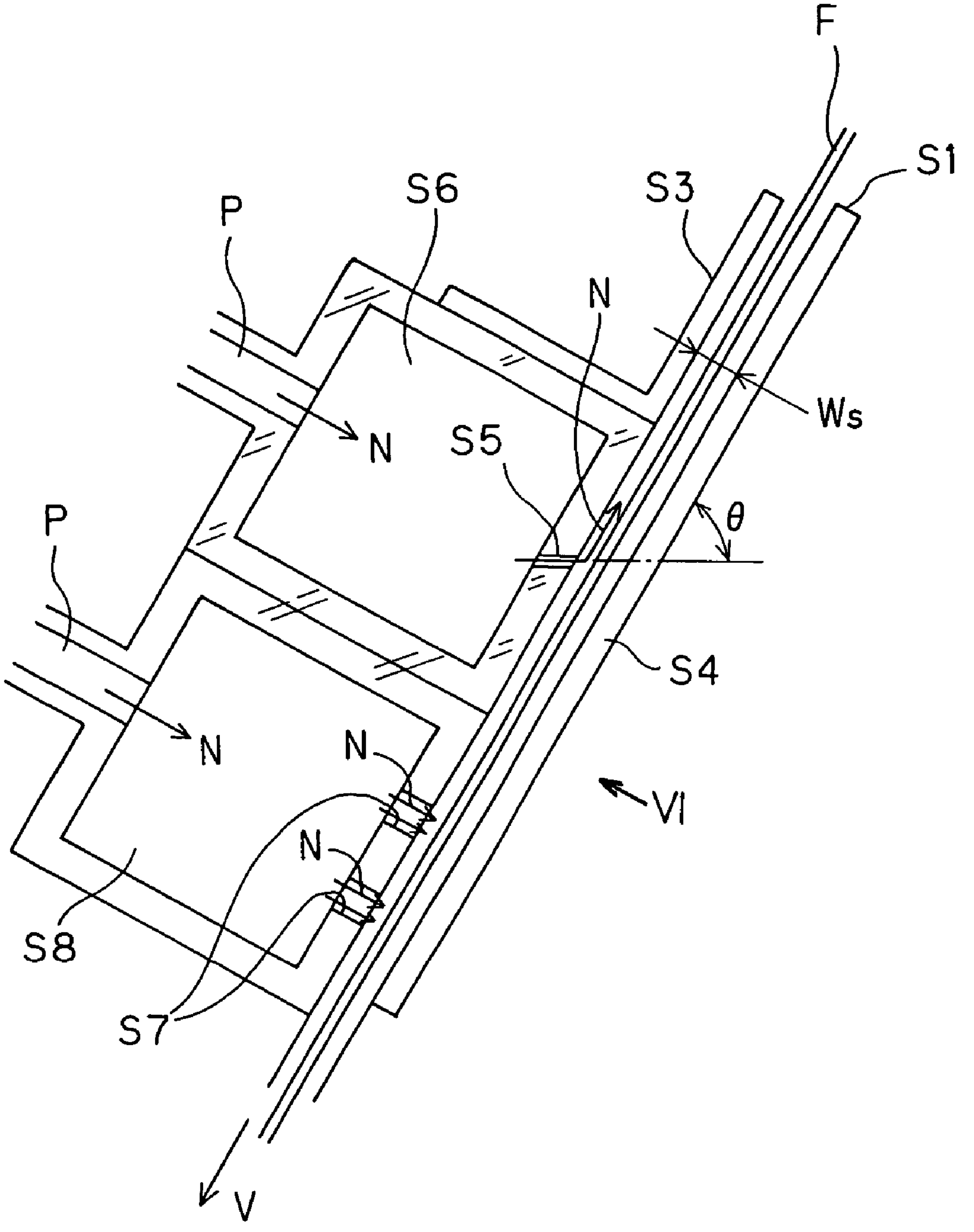
FIG. 5 is a cross-sectional view showing another embodiment of the oxygen cutoff section.
Figure 6:
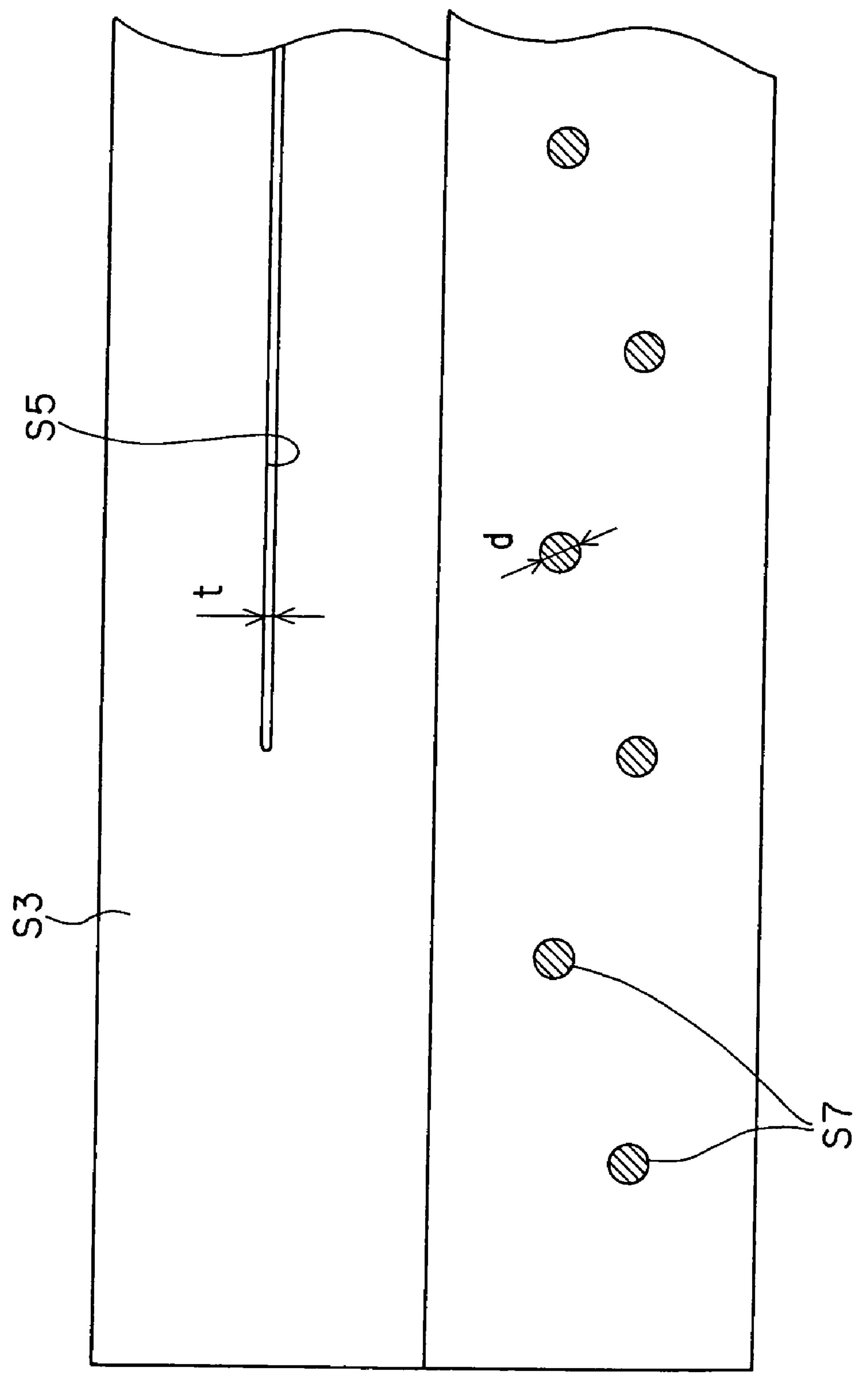
FIG. 6 is a view showing a part of the surface side partition of the oxygen cutoff section of FIG. 5 seen from the direction indicated by the arrow VI.
Figure 7:
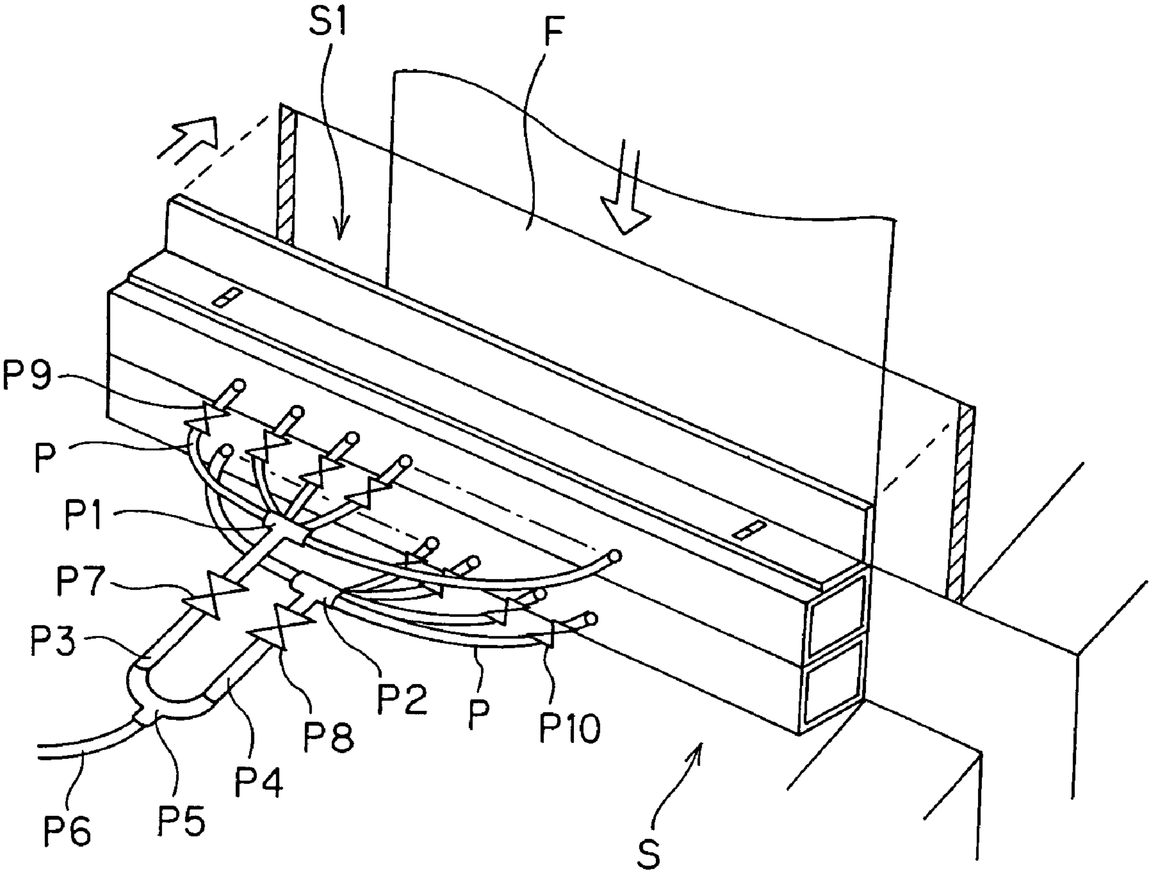
FIG. 7 is a perspective view showing the pipe arrangement for supplying an inert gas to the oxygen cutoff section of FIG. 5.

Next, referring to FIGS. 5 to 7, still another embodiment of the oxygen cutoff section S will be descried. The same reference numeral is denoted to the part which is common to the above described embodiment shown in FIGS. 1 to 4, and differences will be explained mainly.

As shown in FIG. 5, in this embodiment, a slit S5 is provided on the upstream of the oxygen cutoff section S, and plural gas supplying holes S7 are provided on the downstream of the slit S5. The slit S5 is formed so that the blowing direction of the inert gas N inclines toward the upstream of the traveling direction V relative to the direction perpendicular to the traveling direction V of the irradiated object F. In other words, the blowing angle in FIG. 5 is an acute angle, for example it is set at 60°, for example. Accordingly, the inert gas blowing from the slit 5 to the irradiated object F acts on the irradiated object F so as to apply a knife edge, so that the effect of stripping off accompanying air can be improved, thereby effectively restricting the entering of the accompanying air to the irradiation chamber E. In the same way as that of the embodiment of FIG. 2, the blowing opening of the slit S5 is provided on the surface side partition S3 with not projecting from and not caving in the partition and a space S6 for introducing the inert gas N from conduit P is provided behind the blowing slit S5. In this embodiment, as shown in FIG. 6, the slit S5 is provided so as to linearly extend in the width direction of the oxygen cutoff section S, that is to say, in the left and right direction of FIG. 6 over the length as same as that of the irradiated object F or more than that. The number of the slit S5 is not limited one, and plural number of the slits can be provided along the traveling direction of the irradiated object F.

On the other hand, as shown in FIGS. 5 and 6, each gas supplying hole S7 has a circular blowing opening, and is formed as a through-hole extending in the direction perpendicular to the traveling direction of the irradiated object F. Gas supplying holes S7 are provided on the surface side partition S3 so as to supply the inert gas from the same side as the slit S5 to the irradiated object F. Gas supplying holes S7 are arranged in a staggered manner with regard to the width direction of the oxygen cutoff section S. The number, the arrangement and the size of gas supplying holes S7 may be decided in appropriately, however, in view of the reason described later, when the inert gas is supplied from the gas supplying holes S7, the knife edge effect for stripping off the accompanying air as occurred at the slit S5 needs not to be considered. Therefore, a cross-section of the gas supplying holes S7 may be a shape having no or less anisotropy such as a round shape, and the diameter d thereof may be grater than gap t (see FIG. 6) of the slit S5. Each opening of the gas supplying holes S7 on the surface side partition S3 are formed with not projecting from and not caving in the surface side partition S3. A space S8 in which the inert gas N is introduced from the conduit P is provided behind each of the gas supplying holes S7.

FIG. 7 shows a pipe arrangement for the oxygen cutoff section S. For each space S6 and S8, plural conduits P are connected in a line at appropriate pitches along the width direction of the oxygen cutoff section S. Conduits P to the space S6 are gathered at a gathering part P1, conduits P to the space S8 are gathered at a gathering part P2. Gathering parts P1 and P2 are further merged at a junction part P5 through distribution pipes P3 and P4, and the junction part P5 is connected to a common gas source through a main pipe P6. The distribution pipes P3 and P4 are provided with throttle valves P7 and P8 for regulating a flow rate or a pressure of the inert gas, and similarly throttle valves P9 and P10 are also provided between the each of the gathering parts P2 and P3 and the conduits P. By providing the throttles valves P7 and P8, the flow velocity of the inert gas blown from slit S5 and the flow velocity of inert gas blowing from gas supplying holes S7 are adjustable independently from each other. Moreover, by adjusting valve opening of each throttle valve P9, unevenness of the flow velocity of the inert gas blown from the slit S5 may be restrained in the width direction of the oxygen cutoff section S. By adjusting valve opening of each throttle valve P10, in the width direction of the oxygen cutoff section S, unevenness of flow velocity of the inert gas blown from each gas supplying hole S7 may be restrained.

In the above described embodiment, the accompanying air is stripped off and forced out from the feed-in opening S1 by the inert gas blowing from the slit S5 of the oxygen cutoff section S, while a flapping of the irradiated object F is restrained by the pressure of the inert gas supplying from the gas supplying holes S7. Consequently, the incursion of the oxygen is further restrained effectively. That is to say, when the inert gas is blown at high speed from the slim hole such as a slit S5, a pressure balance is destroyed between the front and the back of the film-shaped irradiated object F, and the irradiated object F is drawn to the surface side partition S3. Because tension is acting on the irradiated object F along the traveling direction, if the irradiated object F is drawn to the surface side partition S3, the force for returning the object F is generated. By the force being act on alternately, the irradiated object F may flap in direction of gap Ws. If the flapping occurs, there is a risk that quantity of oxygen passing through the oxygen cutoff section S and breaking into the irradiation chamber E increases. In particular, in this embodiment, the tendency is high because the gap Ws is small, and thus, the faster the velocity of irradiated object, the higher the tendency becomes. However, according to the embodiment of FIGS. 5 to 7, because a lot of gas supplying holes S7 are provided adjacent to the downstream of the slit S5, a support layer of the inert gas for the irradiated object F is formed by the inert gas supplied from these gas supplying holes S7. Consequently, the flapping of the irradiated object F about the direction of the gap Ws can be restrained by the support layer and the irradiated object F can travel linearly and smoothly. Then, the oxygen screening effect in the oxygen cutoff section S can be improved.

The throttle valves P7 to P10 may be omitted or added appropriately as far as the flow velocity of the inert gas blowing from the gas supplying holes S7 can be controlled slower than a flow velocity of the inert gas blowing from the slit S5. If it is possible to blow the inert gas from both of the slit S5 and the gas supplying hole S7 using fixed throttle in a desired state, the throttle valve capable of adjusting the openings may be omitted. As far as the flapping of the irradiated object F is restrained, an appropriate more than one gas supplying holes S7 may be provided.

The invention claimed is:

1. An electron beam irradiation device for irradiating an electron beam to a belt-shaped irradiated object while making the irradiated object travel, an electron beam generating section which generates the electron beam and emits the electron beam to an outside from a transmission window part;

an irradiation chamber adjacent to the transmission window part of the electron beam generating section, having partitions surrounding a periphery, a feed-in opening which opens on the partition to allow the belt-shaped irradiated object to be fed in, and a feed-out opening which opens on the partition to allow the belt-shaped irradiated object to be fed out, and formed as a closed space filled with inert gas, in which the electron beam emitted from the transmission window section is irradiated to the belt-shaped irradiated object fed in from an outside and travels the inside; and an oxygen cutoff section adjacent to the irradiation chamber on an upstream side in an irradiated object traveling direction, having a feed-in opening for feeding in the belt-shaped irradiated object, and a feed-out opening for feeding out the belt-shaped irradiated object, and formed as a closed space, in which the belt-shaped irradiated object travels to be introduced to the irradiation chamber, the inert gas is blown to the irradiating surface side of the irradiated object, and oxygen in the air accompanying a vicinity of a surface of the irradiated object to flow in is shut off or diluted, wherein:

the oxygen cutoff section surrounds the irradiated object with a surface side partition facing a side of the irradiating surface of the traveling belt-shaped irradiated object, a backface side partition facing to a side opposite to the irradiating surface of the irradiated object, and a pair of sideface side partitions facing both sideface sides of the irradiated object, a gap Ws between the surface side partition and the backface side partition of the oxygen cutoff section, and a gap We between the surface side partition and the backface side partition of the irradiation chamber and across the belt-shaped irradiated object in the irradiation chamber satisfy an inequality Ws<We, the gap Ws between the surface side partition and the backface side partition of the oxygen cutoff section is made uniform or almost uniform throughout an entire area of the oxygen cutoff section and, a blowing slit for the inert gas is provided on the surface side partition of the oxygen cutoff section, with a blowing opening thereof being not projected form or caved in the surface side partition of the oxygen cutoff section.

2. The electron beam irradiation device according to claim 1, further provided with a coating part for coating a liquid electron beam curing resin in a non-curing state on the surface of the irradiated object on the upstream side in the irradiated object traveling direction in the oxygen cutoff section.

3. The electron beam irradiation device according to claim 1, wherein the gap Ws between the surface side partition and the backface side partition of the oxygen cutoff section is set to be wider than a thickness of the irradiated object by a range of 1-20 mm.

4. The electron beam irradiation device according to claim 1, wherein the slit is formed so that a blowing direction of the inert gas from the slit inclines toward the upstream side in the traveling direction relative to a direction perpendicular to the traveling direction of the irradiated object.

5. The electron beam irradiation device according to claim 1, wherein on a downstream side relative to the slit in the traveling direction of the irradiated object, a gas supplying hole for supplying the inert gas for the irradiated object from the same side as the slit is provided.

6. The electron beam irradiation device according to claim 5, comprising a throttle valve for reducing a flow velocity of the inert gas blowing out from the gas supplying hole lower than a flow velocity of the inert gas blowing from the slit.

7. The electron beam irradiation device according to claim 5, wherein the gas supplying hole is formed as a through hole extending in a direction perpendicular to the traveling direction of the irradiated object.

8. The electron beam irradiation device according to claim 7, wherein a diameter of the gas supplying hole is greater than the gap of the slit.

* * * * *